United States Patent
Hofmann et al.

(10) Patent No.: US 7,261,832 B2
(45) Date of Patent: Aug. 28, 2007

(54) METHODS AND APPARATUSES FOR MONITORING AND CONTROLLING MECHANICAL OR CHEMICAL-MECHANICAL PLANARIZATION OF MICROELECTRONIC SUBSTRATE ASSEMBLIES

(75) Inventors: Jim Hofmann, Boise, ID (US); Gundu M. Sabde, Boise, ID (US); Stephen J. Kramer, Boise, ID (US); Scott E. Moore, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 283 days.

(21) Appl. No.: 10/313,950

(22) Filed: Dec. 6, 2002

(65) Prior Publication Data

US 2003/0219962 A1 Nov. 27, 2003

Related U.S. Application Data

(63) Continuation of application No. 09/387,309, filed on Aug. 31, 1999, now Pat. No. 6,492,273.

(51) Int. Cl.
*B44C 1/22* (2006.01)
*C03C 15/00* (2006.01)
*C03C 25/68* (2006.01)
*H01L 21/461* (2006.01)

(52) U.S. Cl. ........................ 216/88; 438/692
(58) Field of Classification Search ............... 438/10, 438/17, 692, 5, 41, 86, 88, 689; 216/86, 216/88, 89; 451/5, 41
See application file for complete search history.

(56) References Cited

U.S. PATENT DOCUMENTS

| | | | |
|---|---|---|---|
| 5,036,015 A | 7/1991 | Sandhu et al. | 437/8 |
| 5,491,113 A | 2/1996 | Murota | 437/225 |
| 5,639,388 A | 6/1997 | Kimura et al. | 216/84 |
| 5,738,562 A | 4/1998 | Doan et al. | 451/5 |
| 5,830,041 A | 11/1998 | Takahashi et al. | 451/8 |
| 6,117,775 A | 9/2000 | Kondo et al. | 438/690 |
| 6,206,754 B1 | 3/2001 | Moore | 451/8 |
| 6,213,846 B1 | 4/2001 | Li et al. | 451/6 |
| 6,230,069 B1 | 5/2001 | Campbell et al. | 700/121 |
| 6,234,878 B1 | 5/2001 | Moore | 451/41 |
| 6,325,706 B1 | 12/2001 | Krusell et al. | 451/296 |
| 6,364,746 B2 | 4/2002 | Moore | 451/8 |
| 6,461,964 B2 | 10/2002 | Hofmann et al. | 438/692 |
| 6,464,824 B1 | 10/2002 | Hofmann et al. | 156/345.16 |
| 6,468,912 B2 | 10/2002 | Hofmann et al. | 438/692 |
| 6,472,325 B2 | 10/2002 | Hofmann et al. | 438/692 |
| 6,492,273 B1 | 12/2002 | Hofmann et al. | 438/692 |
| 6,699,791 B2 * | 3/2004 | Hofmann et al. | 438/692 |
| 6,720,266 B2 * | 4/2004 | Hofmann et al. | 438/692 |
| 6,858,538 B2 * | 2/2005 | Hofmann et al. | 438/692 |

FOREIGN PATENT DOCUMENTS

| | | | |
|---|---|---|---|
| JP | 08-243917 | * | 9/1996 |
| JP | 10-256209 | * | 9/1998 |

* cited by examiner

*Primary Examiner*—Parviz Hassanzadeh
*Assistant Examiner*—Roberts Culbert
(74) *Attorney, Agent, or Firm*—Dorsey & Whitney LLP

(57) ABSTRACT

Methods and devices for mechanical and/or chemical-mechanical planarization of semiconductor wafers, field emission displays and other microelectronic substrate assemblies. One method of planarizing a microelectronic substrate assembly in accordance with the invention includes pressing a substrate assembly against a planarizing surface of a polishing pad at a pad/substrate interface defined by a surface area of the substrate assembly contacting the planarizing surface. The method continues by moving the substrate assembly and/or the polishing pad with respect to the other to rub at least one of the substrate assembly and the planarizing surface against the other at a relative velocity. As the substrate assembly and polishing pad rub against each other, a parameter indicative of drag force between the substrate assembly and the polishing pad is measured or sensed at periodic intervals. The drag force parameter, for example, can be lateral displacement or lateral forces between a first component coupled to one of the substrate assembly or the polishing pad and a second component in either a carrier assembly holding the substrate assembly or a table supporting the polishing pad. The drag force parameter can be measured along a lateral axis to produce a waveform having minimum and maximum peaks relative to minimum and maximum peak drag forces between the substrate assembly and the polishing pad along the axis. The maximum peak drag forces or the difference of the minimum and maximum peak drag forces are processed to generate a force-time relationship. The status of a parameter, such as the onset of planarity or the endpoint of the process, is then estimated by analyzing the force-time relationship.

6 Claims, 13 Drawing Sheets

METHODS AND APPARATUSES FOR MONITORING AND CONTROLLING MECHANICAL OR CHEMICAL-MECHANICAL PLANARIZATION OF MICROELECTRONIC SUBSTRATE ASSEMBLIES

CROSS-REFERENCE TO RELATED APPLICATION

This application is a continuation of U.S. patent application Ser. No. 09/387,309, filed Aug. 31, 1999 now U.S. Pat. No. 6,492,273.

TECHNICAL FIELD

The present invention relates to methods and apparatuses for monitoring and controlling mechanical and/or chemical-mechanical planarization of semiconductor wafers, field emission displays and other types of microelectronic substrate assemblies.

BACKGROUND OF THE INVENTION

Mechanical and chemical-mechanical planarizing processes (collectively "CMP") are used in the manufacturing of electronic devices for forming a flat surface on semiconductor wafers, field emission displays and many other microelectronic substrate assemblies. CMP processes generally remove material from a substrate assembly to create a highly planar surface at a precise elevation in the layers of material on the substrate assembly.

FIG. 1 is a schematic isometric view of a web-format planarizing machine 10 for planarizing a microelectronic substrate assembly 12. The planarizing machine 10 has a table 11 with a rigid panel or plate to provide a flat, solid support surface 13 for supporting a portion of a web-format planarizing pad 40 in a planarizing zone "A." The planarizing machine 10 also has a pad advancing mechanism including a plurality of rollers to guide, position, and hold the web-format pad 40 over the support surface 13. The pad advancing mechanism generally includes a supply roller 20, first and second idler rollers 21a and 21b, first and second guide rollers 22a and 22b, and a take-up roller 23. As explained below, a motor (not shown) drives the take-up roller 23 to advance the pad 40 across the support surface 13 along a pad travel path T-T. The motor can also drive the supply roller 20. The first idler roller 21a and the first guide roller 22a press an operative portion of the pad against the support surface 13 to hold the pad 40 stationary during operation.

The planarizing machine 10 also has a carrier assembly 30 to translate the substrate assembly 12 across the pad 40. In one embodiment, the carrier assembly 30 has a head 32 to pick up, hold and release the substrate assembly 12 at appropriate stages of the planarizing process. The carrier assembly 30 also has a support gantry 34 and a drive assembly 35 that can move along the gantry 34. The drive assembly 35 has an actuator 36, a drive shaft 37 coupled to the actuator 36, and an arm 38 projecting from the drive shaft 37. The arm 38 carries the head 32 via another shaft 39. The actuator 36 orbits the head 32 about an axis B-B to move the substrate assembly 12 across the pad 40.

The polishing pad 40 may be a non-abrasive polymeric pad (e.g., polyurethane), or it may be a fixed-abrasive polishing pad in which abrasive particles are fixedly dispersed in a resin or another type of suspension medium. A planarizing fluid 50 flows from a plurality of nozzles 49 during planarization of the substrate assembly 12. The planarizing fluid 50 may be a conventional CMP slurry with abrasive particles and chemicals that etch and/or oxidize the surface of the substrate assembly 12, or the planarizing fluid 50 may be a "clean" non-abrasive planarizing solution without abrasive particles. In most CMP applications, abrasive slurries with abrasive particles are used on non-abrasive polishing pads, and non-abrasive clean solutions without abrasive particles are used on fixed-abrasive polishing pads.

In the operation of the planarizing machine 10, the pad 40 moves across the support surface 13 along the pad travel path T-T either during or between planarizing cycles to change the particular active portion of the polishing pad 40 in the planarizing zone A. For example, the supply and take-up rollers 20 and 23 can drive the polishing pad 40 between planarizing cycles such that a point P moves incrementally across the support surface 13 to a number of intermediate locations $I_1$, $I_2$, etc. Alternatively, the rollers 20 and 23 may drive the polishing pad 40 between planarizing cycles such that the point P moves all the way across the support surface 13 to completely remove a used portion of the pad 40 from the planarizing zone A. The rollers may also continuously drive the polishing pad 40 at a slow rate during a planarizing cycle such that the point P moves continuously across the support surface 13. Thus, the polishing pad 40 should be free to move axially over the length of the support surface 13 along the pad travel path T-T.

CMP processes should consistently and accurately produce a uniform, planar surface on substrate assemblies to enable circuit and device patterns to be formed with photolithography techniques. As the density of integrated circuits increases, it is often necessary to accurately focus the critical dimensions of the photo-patterns to within a tolerance of approximately 0.1 µm. Focusing photo-patterns to such small tolerances, however, is difficult when the planarized surfaces of substrate assemblies are not uniformly planar. Thus, to be effective, CMP processes should create highly uniform, planar surfaces on substrate assemblies.

In the highly competitive semiconductor industry, it is also desirable to maximize the throughput of CMP processing by producing a planar surface on a substrate assembly as quickly as possible. The throughput of CMP processing is a function of several factors; one of which is the ability to accurately stop CMP processing at a desired endpoint. In a typical CMP process, the desired endpoint is reached when the surface of the substrate assembly is planar and/or when enough material has been removed from the substrate assembly to form discrete components (e.g., shallow trench isolation areas, contacts, damascene lines). Accurately stopping CMP processing at a desired endpoint is important for maintaining a high throughput because the substrate assembly may need to be re-polished if it is "under-planarized," or too much material can be removed from the substrate assembly if it is "over-polished." For example, over-polishing can completely destroy a section of the substrate assembly or cause "dishing" in shallow-trench-isolation structures. Thus, it is highly desirable to stop CMP processing at the desired endpoint.

One method for determining the endpoint of CMP processing is described in U.S. Pat. No. 5,036,015 issued to Sandhu ("Sandhu"), which is herein incorporated by reference. Sandhu discloses detecting the planar endpoint by sensing a change in friction between a wafer and the polishing medium. Such a change of friction may be produced by a different coefficient of friction at the wafer surface as one material (e.g., an oxide) is removed from the wafer to expose another material (e.g., a nitride). In addition to the different coefficients of friction caused by a change of material at the substrate surface, the friction between the wafer and the planarizing medium can change during CMP processing because the surface area of the substrate contacting the polishing pad changes as the substrate becomes more planar. Sandhu discloses endpointing CMP processing by measuring the current draw through a drive motor to estimate the friction between the substrate assembly and the polishing pad, and then detecting a change in the motor current to estimate planarity or an interface between materials.

Although Sandhu discloses a viable process for endpointing CMP processing, the change in current draw through a drive motor may not accurately indicate the endpoint of a substrate assembly. For example, because the friction between the substrate assembly and the planarizing medium can increase or decrease throughout a planarizing cycle according to both topography of the substrate assembly and the materials, it may be difficult to identify a definite change in the motor current indicating that the endpoint has been reached. Moreover, other parameters that are not related to the drag force between the pad and the substrate assembly, such as friction losses and other power losses in the motors, gearboxes or other components, may change the current draw through the motors independently from the drag force or have a significantly greater magnitude than the drag force. The change in current through the drive motors, therefore, may not accurately reflect the drag force between the wafer and the polishing pad because the drag force is not the only factor or even the primary factor that influences the current draw. Thus, it would be desirable to develop an apparatus and method for more accurately endpointing planarization of microelectronic substrate assemblies.

SUMMARY OF THE INVENTION

The present invention is directed toward mechanical and/or chemical-mechanical planarization of semiconductor wafers, field emission displays and other microelectronic substrate assemblies. One method of planarizing a microelectronic substrate assembly in accordance with the invention includes pressing a substrate assembly against a planarizing surface of a polishing pad at a pad/substrate interface defined by a surface area of the substrate assembly contacting the planarizing surface. The method continues by moving the substrate assembly and/or the polishing pad with respect to the other to rub at least one of the substrate assembly and the planarizing surface against the other at a relative velocity. As the substrate assembly and polishing pad rub against each other, a parameter indicative of drag force between the substrate assembly and the polishing pad is measured or sensed at periodic intervals. The drag force parameter, for example, can be lateral displacement or lateral forces between a first component coupled to one of the substrate assembly or the polishing pad and a second component in either a carrier assembly holding the substrate assembly or a table supporting the polishing pad. The drag force parameter can be measured along a lateral axis to produce a waveform having minimum and maximum peaks relative to minimum and maximum peak drag forces between the substrate assembly and the polishing pad along the lateral axis. The maximum peak drag forces, or the differences between the maximum and minimum peak drag forces, are processed to generate a force-time relationship.

The status of a parameter, such as the onset of planarity or the endpoint of the process, is then estimated by analyzing the force-time relationship.

In one particular embodiment of a method in accordance with the invention, the substrate assembly comprises a shallow-trench-isolation structure including a substrate having trenches, an endpoint layer over the substrate, and a cover layer over the endpoint layer that fills the trenches. The procedure of estimating the status of a parameter of the planarizing process comprises assessing an endpoint at the endpoint layer. In this particular embodiment, the endpoint is assessed by performing a first regression on a downward slope in the force-time relationship to determine a first line, performing a second regression on a relatively flat slope in the force-time relationship to determine a second line, and assessing an exposure time at an intersection of the first and second lines. The exposure time provides an estimation of when portions of the endpoint layer at the desired endpoint elevation are exposed to the polishing pad. Several embodiments of methods in accordance with the invention further include terminating removal of material from the substrate assembly at an endpoint time equal to the exposure time plus a predetermined over-polish time.

DETAILED DESCRIPTION OF THE INVENTION

The present invention relates to planarizing machines and methods for monitoring and controlling planarizing processes in mechanical or chemical-mechanical planarization of microelectronic substrate assemblies. Many specific details of the invention are described below with reference to planarizing semiconductor wafers using web-format and rotary planarizing machines to provide a thorough understanding of such embodiments. For example, general aspects of a representative web-format planarizing machine and illustrative methods for controlling CMP processing using this machine are initially described below with reference to FIGS. 2-6. Several detailed embodiments of planarizing machines for practicing methods in accordance with the invention are then described with reference to FIGS. 7-14. The present invention, however, may have additional embodiments and/or can be practiced without several of the details described in the following description.

A. Representative Planarizing Machines and Monitoring Systems

Figure 1:
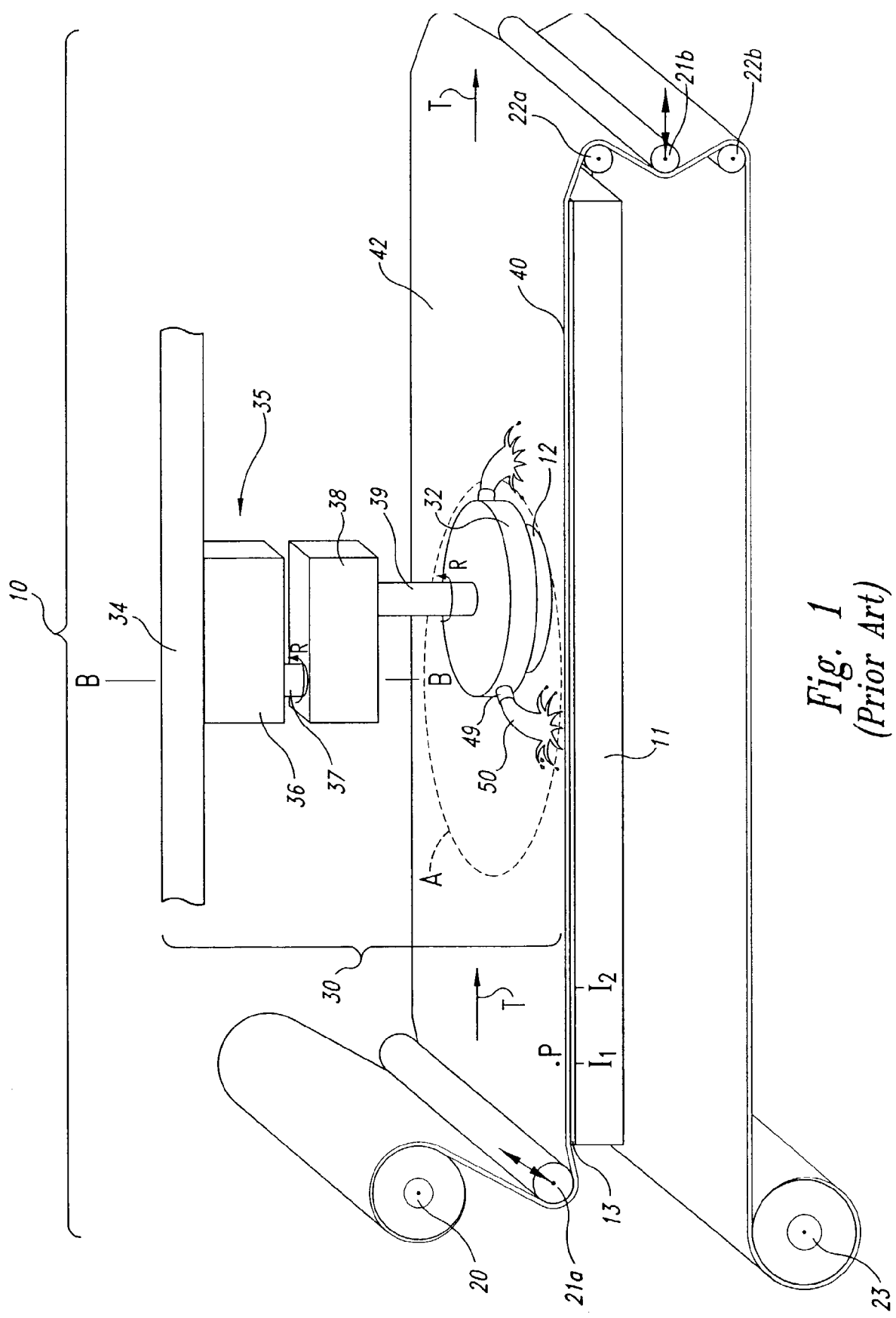
FIG. 1 is an isometric view of a web-format planarizing machine in accordance with the prior art.
Figure 2:
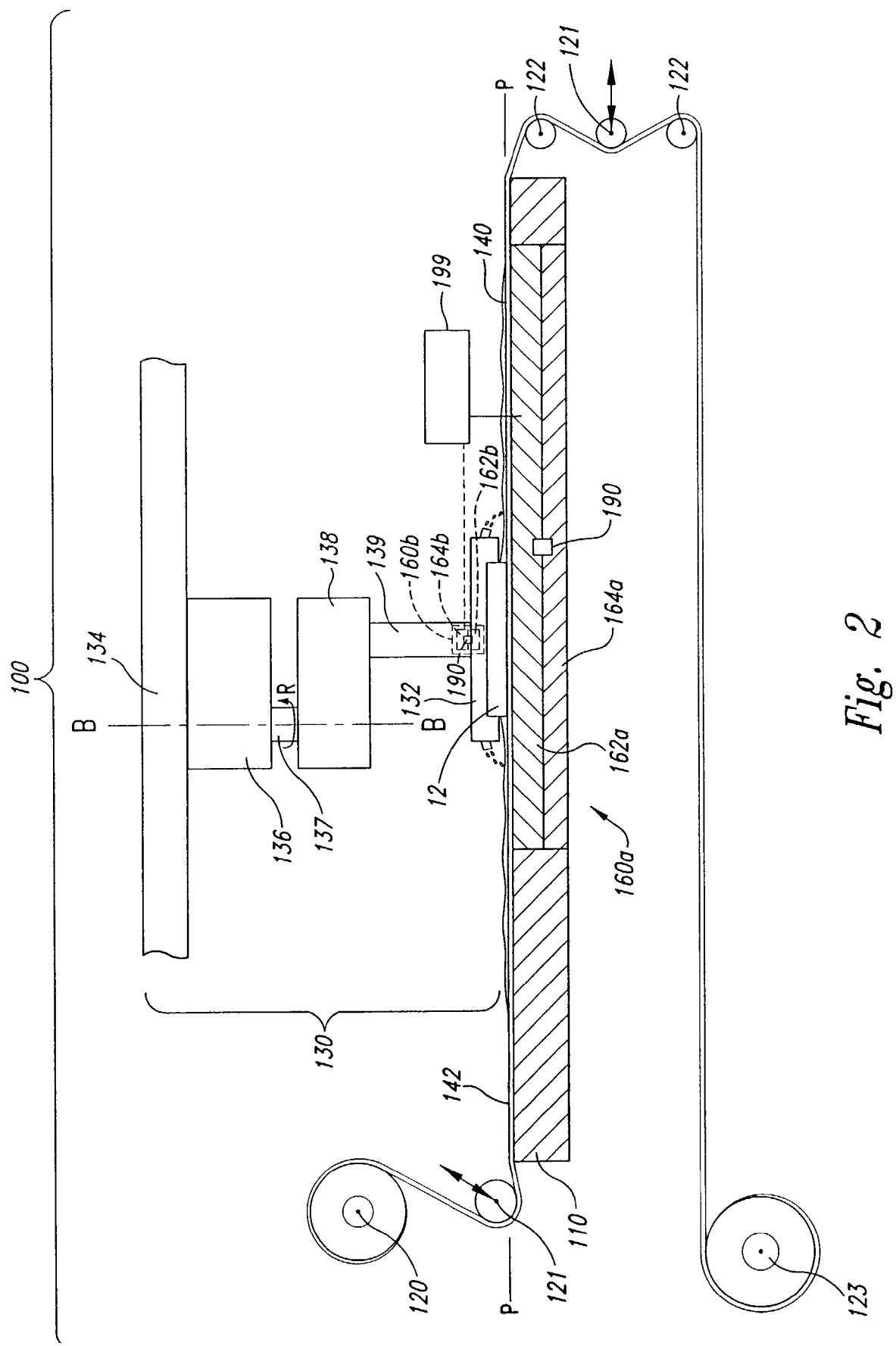
FIG. 2 is a schematic cross-sectional view of a web-format planarizing machine having a monitoring system in accordance with an embodiment of the invention.

FIG. 2 is a schematic cross-sectional view of a web-format planarizing machine 100 having a monitoring system for monitoring and controlling planarization of a microelectronic substrate assembly 12 in accordance with the invention. The planarizing machine 100 includes a table 110, a carrier assembly 130 over the table 110, and a polishing pad 140 on the table 110. The carrier assembly 130 and the polishing pad 140 can be substantially the same as those describe above with reference to FIG. 1. The polishing pad 140 is accordingly coupled to a pad-advancing mechanism having a plurality of rollers 120-123. The pad-advancing mechanism can also be the same as that described above with reference to FIG. 1.

The planarizing machine 100 also includes a monitoring system that measures the drag force between the substrate assembly 12 and the polishing pad 140 during planarization to endpoint or control other aspects of the CMP process. The monitoring system can include a drag force measuring assembly 160 (identified by reference numbers 160a and 160b) to measure a parameter that accurately indicates the drag force between the pad 140 and the substrate assembly 12 along a lateral axis. The lateral axis can extend generally parallel to a plane defined by the interface of the pad 140 and the substrate assembly 12. The drag force measuring assembly 160 generates a waveform having minimum and maximum drag force peaks along the lateral axis. The waveform, for example, can be a generally sinusoidal wave with varying amplitudes corresponding to the minimum and maximum drag forces along the lateral axis.

The drag force measuring assembly 160 can be coupled to the table 110 and/or a carrier head 132 of the carrier assembly 130. The drag force measuring assembly 160 is generally configured to isolate a drag force parameter indicative of drag forces between the substrate assembly 12 and the polishing pad 140 that is not influenced by energy losses in motors, gears or other components that drive either the polishing pad 140 or the carrier head 132. For example, the drag force measuring assembly 160a in the table 110 can have a first component 162a coupled to the polishing pad 140, a second component 164a that is fixedly attached to or integral with the table 110, and a force detector 190 to detect lateral forces or lateral displacement between the first component 162a and a second component 164a. The drag force measuring assembly 160b in the carrier assembly 130 can include a first component 162b coupled to the substrate assembly 12 and a second component 164b coupled to either the carrier head 132, the shaft 139 or another component of the carrier assembly 130. The drag force measuring assembly 160b also has a force detector 190 to detect lateral forces or lateral displacement between the first and second components 162b and 164b. The drag force parameter can accordingly be lateral displacement or lateral forces between the first component 162 (identified by reference numbers 162a and 162b) and the second component 164 (identified by reference numbers 164a and 164b) corresponding to a shear force between the substrate assembly 12 and the planarizing surface 142 of the polishing pad 140. Several embodiments of force detectors 190 and drag force measuring assemblies that isolate the drag force parameter from power losses are described in detail below with reference to FIGS. 7-14.

The drag force monitoring system can also include a processor 199 coupled to the drag force measuring assembly 160. The processor 199 receives signals from the drag force measuring assembly 160 corresponding to the waveform of the measured drag forces. The processor generates a force-time relationship between the peak drag forces of the waveform and time. In one particular application of the present invention for planarizing a substrate assembly having a shallow-trench-isolation structure ("STI"), the force-time relationship generally has an initial section with an increasing slope, an intermediate section with a decreasing slope, and a final section with a relatively flat slope. The processor 199 can further perform a first regression on the intermediate section to generate a first line and a second regression on the final section to generate a second line. The processor determines a reference time indicating the exposure of an endpointing layer by determining the time corresponding to the intersection between the first and second lines. The processor 199 then endpoints CMP processing of the STI substrate assembly at an estimated endpoint time equal to approximately the reference time plus a predetermined over-polish time. Several methods for controlling or endpointing CMP processing using the force-time relationship between the peak drag forces and time are set forth below.

B. Illustrative Methods for Endpointing and Controlling CMP Processing

Figure 3:
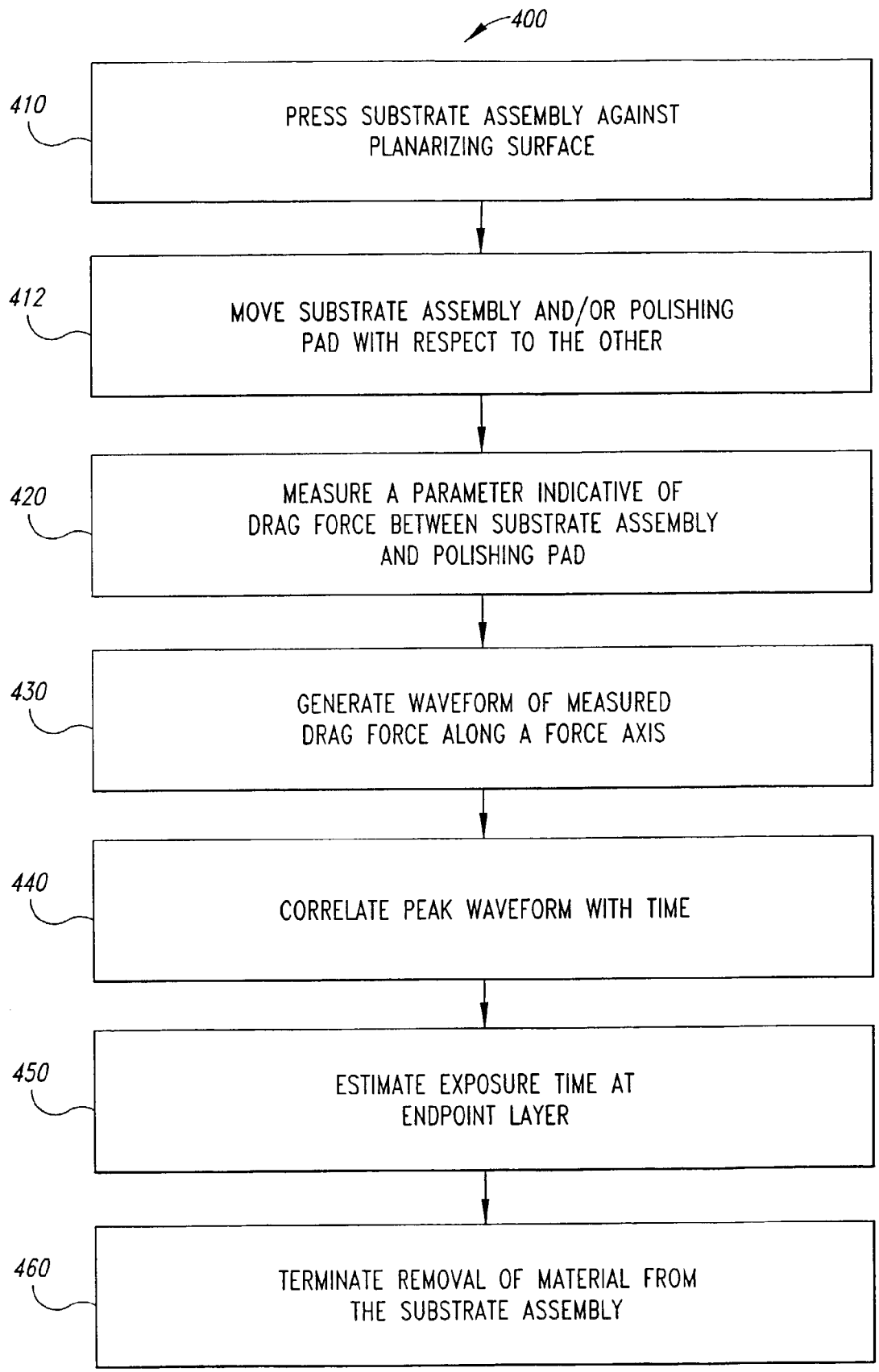
FIG. 3 is a flowchart of an illustrative method in accordance with one embodiment of the invention.

FIG. 3 is a flowchart of a method for endpointing CMP processing of the substrate assembly 12 in accordance with one embodiment of the invention. The method illustrated in FIG. 3 is a comprehensive method that includes several procedures that may be combined with each other or completely excluded in other embodiments of the invention. Accordingly, other embodiments of the invention may also include different procedures or a different order of procedures. The CMP process of FIG. 3 is also applicable to several different types of semiconductor wafers, field emission displays and other microelectronic substrate assemblies.

The planarizing process illustrated in FIG. 3 includes removing material from a substrate assembly by pressing the substrate assembly against a planarizing surface (procedure 410) and moving the substrate assembly and/or the polishing pad with respect to the other (procedure 412). The polishing pad can be the web-format pad 140 shown in FIG. 2 or a rotary pad. The polishing pad can also be a fixed-abrasive pad with abrasive particles fixedly attached to a suspension medium or a non-abrasive pad without abrasive particles.

The substrate assembly is generally pressed against the polishing pad in the presence of a planarizing solution.

Figure 4:
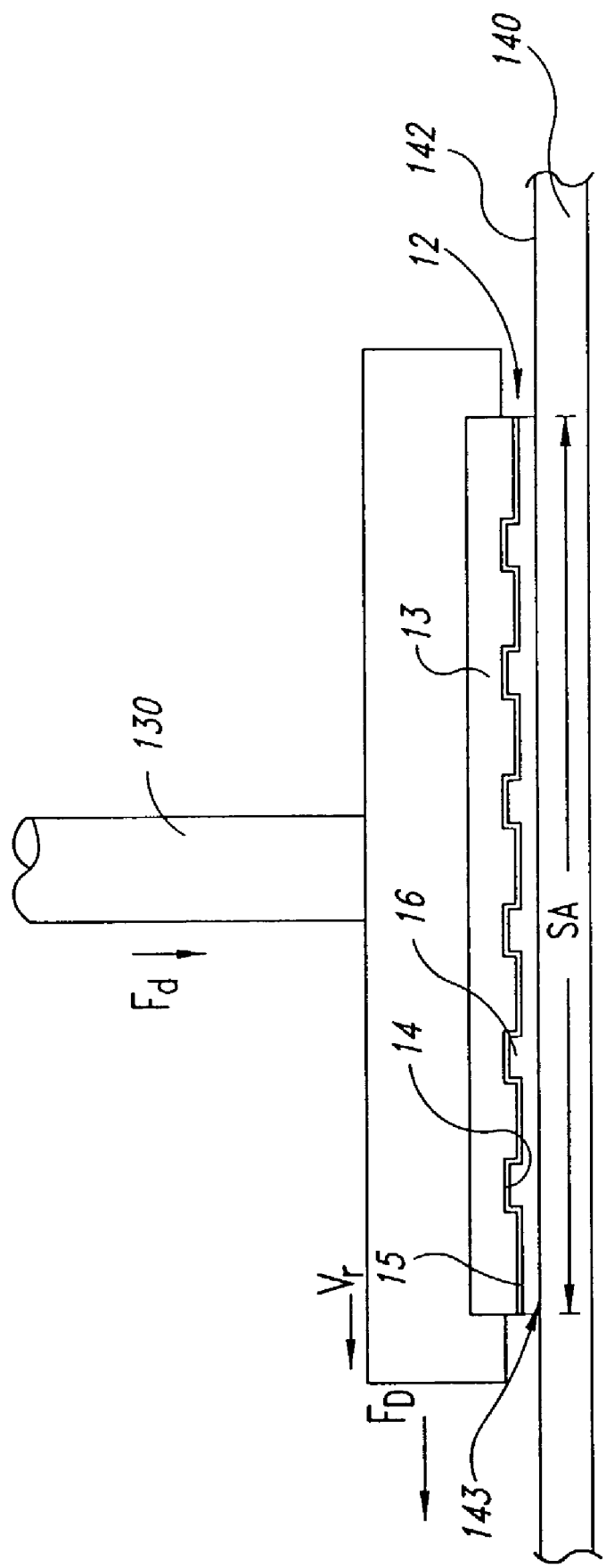
FIG. 4 is a schematic cross-sectional view of a substrate assembly being planarized with a method in accordance with an embodiment of the invention.

FIG. 4 is a schematic cross-sectional view illustrating the removal of material from an STI substrate assembly 12. The STI substrate assembly 12 has a substrate 13 with a plurality of trenches 14, an endpointing layer 15 composed of a first material with a first polishing rate, and a fill layer 16 or cover layer composed of a second material having a second polishing rate different than the endpointing layer 15. The endpointing layer 15 is generally a polish-stop layer that has a lower polishing rate than the cover layer 16 to inhibit planarization below lands 17 at a desired endpoint elevation in the substrate assembly 12. In an alternate embodiment, the endpoint layer 15 can have a higher polishing rate than the cover layer 16. The endpointing layer 15, for example, can be a silicon nitride or carbon polish-stop layer, and the fill layer 16 can be a doped or undoped silicon dioxide layer. The substrate assembly 12 contacts the planarizing surface 142 of the polishing pad 140 at a pad/substrate interface 143 defined by the surface area "SA" in contact with the planarizing surface 142. The carrier assembly 130 presses the substrate assembly 12 against the planarizing surface 142 at a downforce $F_d$. The carrier assembly 130 also moves the substrate assembly 12 with respect to the polishing pad 140 to rub the substrate assembly 12 against the planarizing surface 142 at a relative velocity $V_r$. The friction between the substrate assembly 12 and the planarizing surface 142 creates a drag force $F_D$ that acts against the polishing pad 140.

Referring again to FIG. 3, the planarizing process 400 continues with a measuring procedure 420 that includes measuring a drag force parameter indicative of the drag force $F_D$ between the substrate assembly 12 and the polishing pad 140. The drag force parameter is generally isolated from energy losses in components that drive either the polishing pad or the substrate assembly to provide a more accurate indication of the drag force $F_D$ at the pad/substrate interface 143 (FIG. 4). The drag force parameter can be measured along a lateral axis that is generally parallel to a plane defined by the pad/substrate interface to generate the sinusoidal waveform (examples of lateral axes are identified by lines $L_1$ or $L_2$ of FIG. 7). Several devices for isolating and measuring the drag force parameter are described below with reference to FIGS. 7-14.

Figure 5:
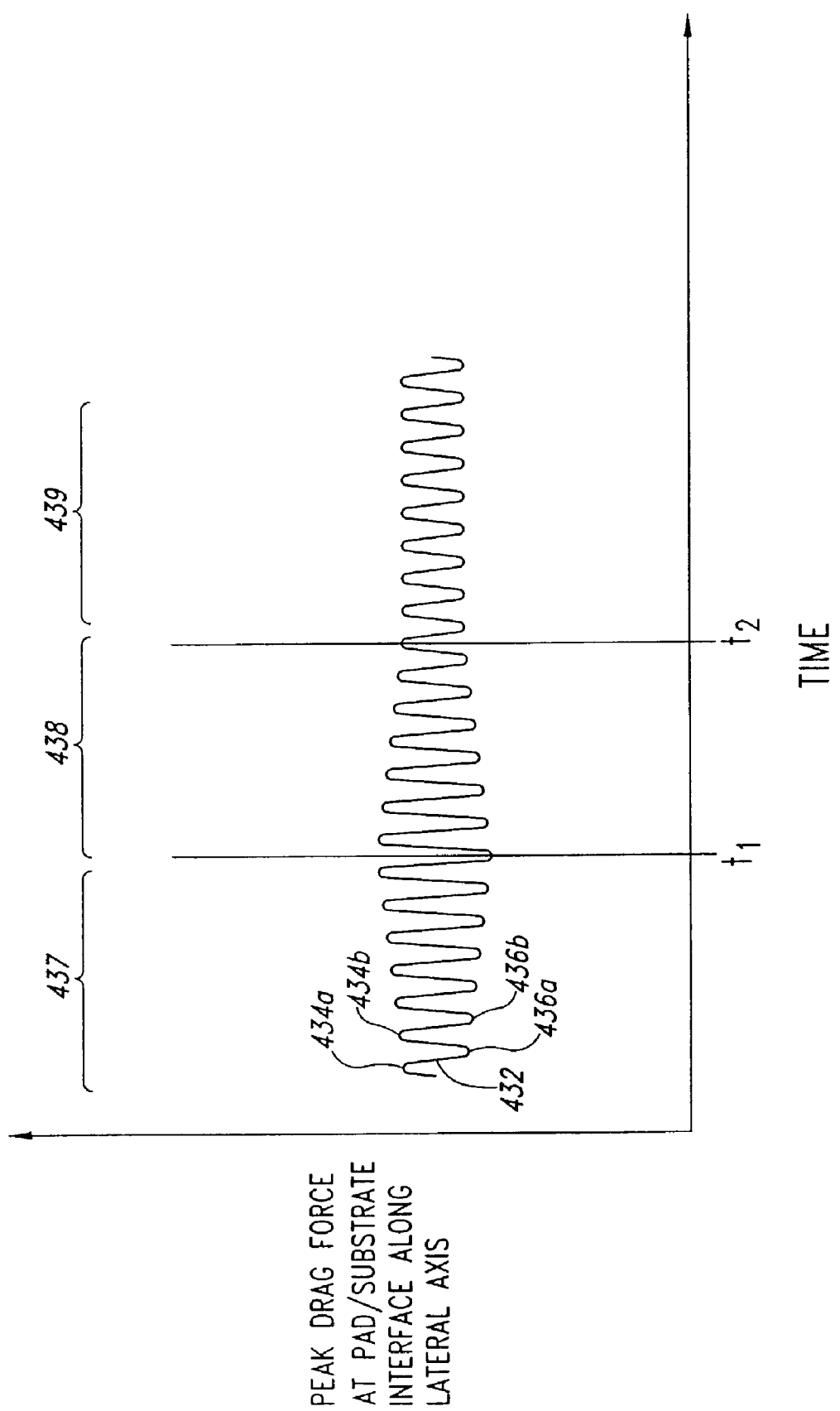
FIG. 5 is a graph of a waveform of the drag forces at the pad/substrate interface along a lateral axis versus time in accordance with an embodiment of the invention.

The planarizing process continues with a data processing procedure 430 in which a waveform of the measured drag force is generated. FIG. 5 is a graph of a waveform 432 of the measured drag force $F_D$ along a lateral axis at the pad/substrate interface for an STI substrate assembly over time. The measured waveform 432 for the STI substrate assembly has a plurality of maximum peaks 434 (identified by reference numbers 434a and 434b) and a plurality of minimum peaks 436 (identified by reference numbers 436a and 436b). The maximum and minimum peaks 434 and 436 correspond to the maximum and minimum drag forces between the pad 140 and a substrate assembly 12 along the lateral axis. The waveform 432 is generally a sinusoidal waveform in which the amplitude between the maximum peaks 434 and the minimum peaks 436 indicates increases or decreases in the drag force at the pad/substrate interface. For an STI substrate assembly, the waveform 432 has a first section 437 in which the peak-to-peak amplitude increases, a second section 438 in which the peak-to-peak amplitude decreases, and a third section 439 in which the peak-to-peak amplitude remains substantially constant.

The method 400 shown in FIG. 3 further continues with a correlating procedure 440 in which the maximum peak drag forces 434, or the differences between the maximum and minimum peak drag forces 434 and 436 (FIG. 5), are correlated with time to generate a force-time relationship. In another embodiment, the correlating procedure 440 can correlate the minimum peak drag forces 436 with time. The correlating procedure 440 produces a peak drag force curve corresponding to the peak drag forces along the lateral axis.

Figure 6:
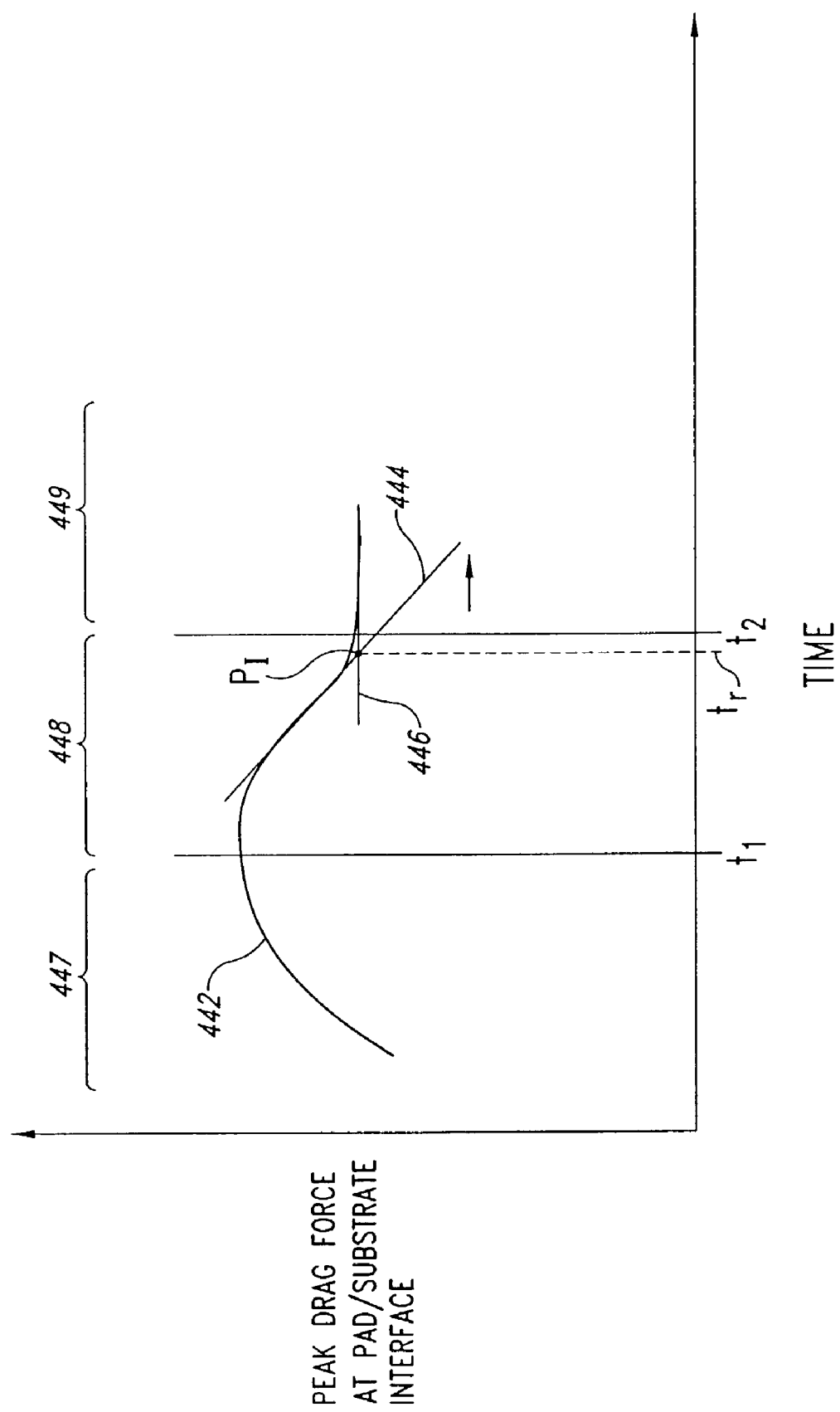
FIG. 6 is a graph of the peak drag forces at the pad/substrate interface versus time.

FIG. 6 is a graph illustrating a peak drag force curve 442 corresponding to either the maximum peak drag forces 434 or the differences between the maximum and minimum peak drag forces 434 and 436 of the waveform 432 shown in FIG. 5. The times $t_1$ and $t_2$ in FIG. 5 correspond to the times $t_1$ and $t_2$ in FIG. 6. The peak drag force curve 442 has a first or initial section 447 with an increasing slope corresponding to the increasing peak drag forces 434 in the first section 437 of the waveform 432 shown in FIG. 5. The peak drag force curve 442 has a second or intermediate section 448 with a generally downward slope corresponding to the decreasing peak drag forces 434 of the waveform 432 shown in FIG. 5. The peak drag force curve 442 also has a third or end section 449 with a relatively flat slope corresponding to the substantially constant peak drag forces 434 in the third section 439 of the waveform 432 shown in FIG. 5. The peak drag force curve 442 is used to estimate the endpoint of the planarizing cycle or to estimate the status of another parameter of the CMP process.

The process 400 of FIG. 3 further includes an estimating procedure 450 for estimating a reference time $t_r$ corresponding to an exposure time that the lands 17 of the endpoint layer 15 (FIG. 4) are exposed during planarization. The estimating procedure includes performing a mathematical regression of the intermediate section 448 of the peak drag force curve 442 to create a downwardly sloping first line 444, and performing a regression of the end section 449 of the peak drag force curve 442 to determine a second line 446. Suitable software or hardware for performing the regressions of the peak drag force curve 442 are commercially available and known to those skilled in the semiconductor manufacturing arts. The reference time is estimated by determining the time corresponding to the intersection between the first line 444 and the second line 446.

The method 400 of FIG. 3 continues with a terminating procedure 460 that terminates removal of the material from the substrate assembly 12 at an estimated endpoint time. The terminating procedure 460 calculates the estimated endpoint time by adding a predetermined over-polish time to the reference time $t_r$. In a typical STI application, the over-polish time is approximately 10-50 seconds, and more specifically approximately 25-35 seconds. The estimating procedure 450 actually occurs during the initial portion of the third section 449 of the peak-drag force curve 442 (FIG. 6) because a sufficient number of data points indicating that the planarizing process has entered the end section 449 must be obtained. In several STI applications, the reference time $t_r$ corresponding to the exposure of the endpoint layer 15 (FIG. 4) can be calculated approximately 7 seconds after the peak drag force curve 442 enters the third section 449. Therefore, because the over-polish time is approximately 10-50 seconds after the reference time $t_r$ occurs, the terminating procedure 460 can estimate the endpoint of the planarizing process in situ and in real time.

C. Embodiments of Endpointing and Drag Force Measuring Assemblies

FIGS. 7-14 illustrate several embodiments of endpointing apparatuses that execute the measuring procedure 420 (FIG. 3) by isolating a drag force parameter related to the drag force between the substrate assembly 12 and the polishing pad 140 from other energy losses, and measuring the isolated drag force during planarization. For the following description, the endpointing apparatuses described in FIGS. 7-14 define one type of drag force measuring assembly 160 shown in FIG. 2. Therefore, it will be understood that the drag force measured with the endpointing apparatuses shown in FIGS. 7-14 can also be used to diagnose or control other aspects of the CMP processes described above with reference to FIGS. 2-6.

Figure 7:
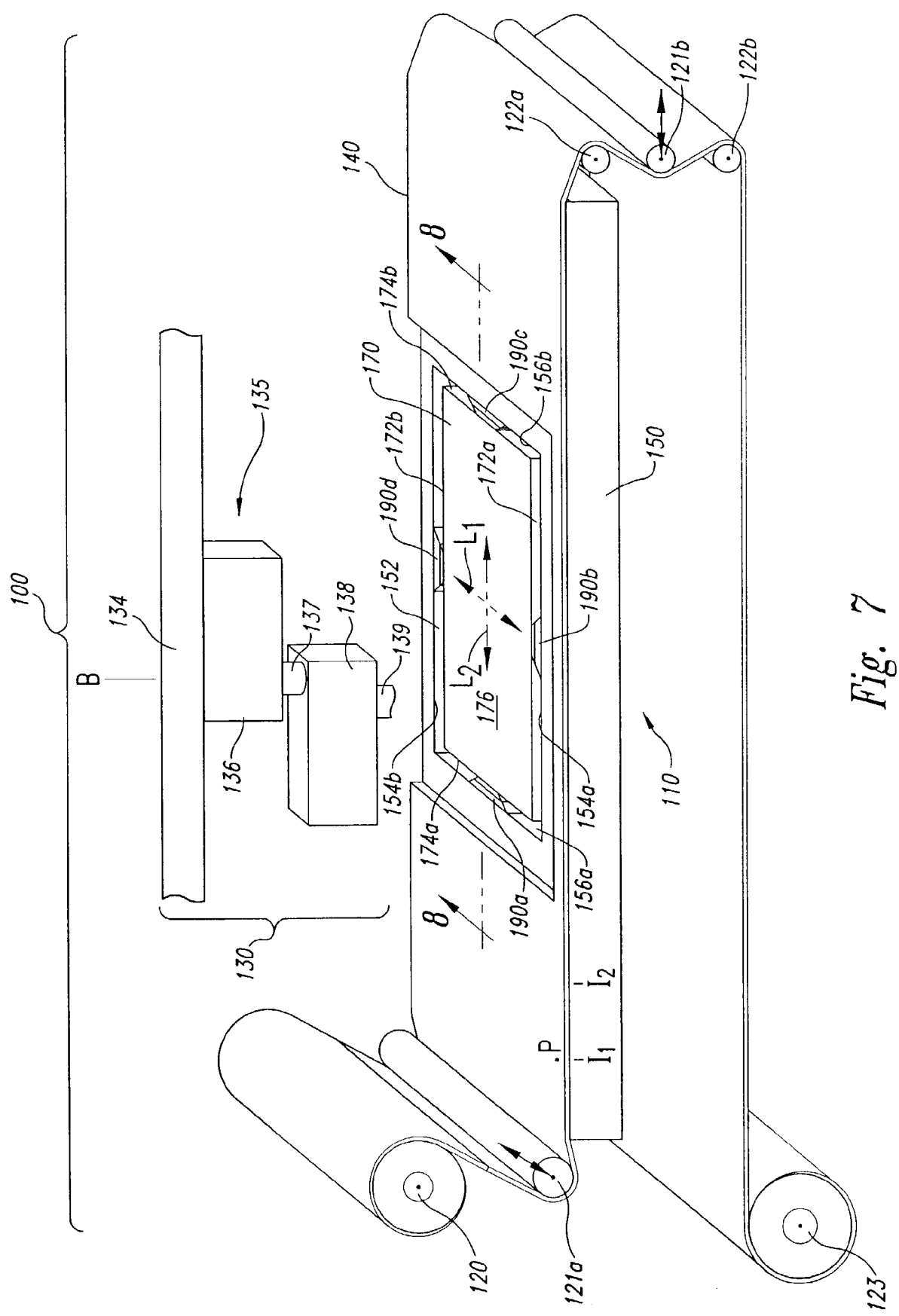
FIG. 7 is a schematic isometric view of a web-format planarizing machine having a cut-away portion illustrating an endpointing apparatus in accordance with an embodiment of the invention.

FIG. 7 is a schematic isometric view of the web-format planarizing machine 100 including an endpointing apparatus for measuring the drag force between the substrate assembly 12 and the polishing pad 140 during planarization. The endpointing apparatus generally includes a secondary support member defined by a sub-platen 150, a primary support member defined by a platen 170, and at least one force detector 190 between the sub-platen 150 and the platen 170. The platen 170 and the sub-platen 150 can be separate components of the table 110. The polishing pad 140 is releasably coupled to the platen 170 so that the drag forces $F_D$ between the substrate assembly 12 and the pad 140 exert lateral forces against the platen 170 independent of friction losses or power losses in the carrier assembly 130. The lateral force exerted by the pad 140 against the platen 170 is thus an isolated parameter indicative of the drag $F_D$ between the substrate assembly 12 and the pad 140.

Figure 8:
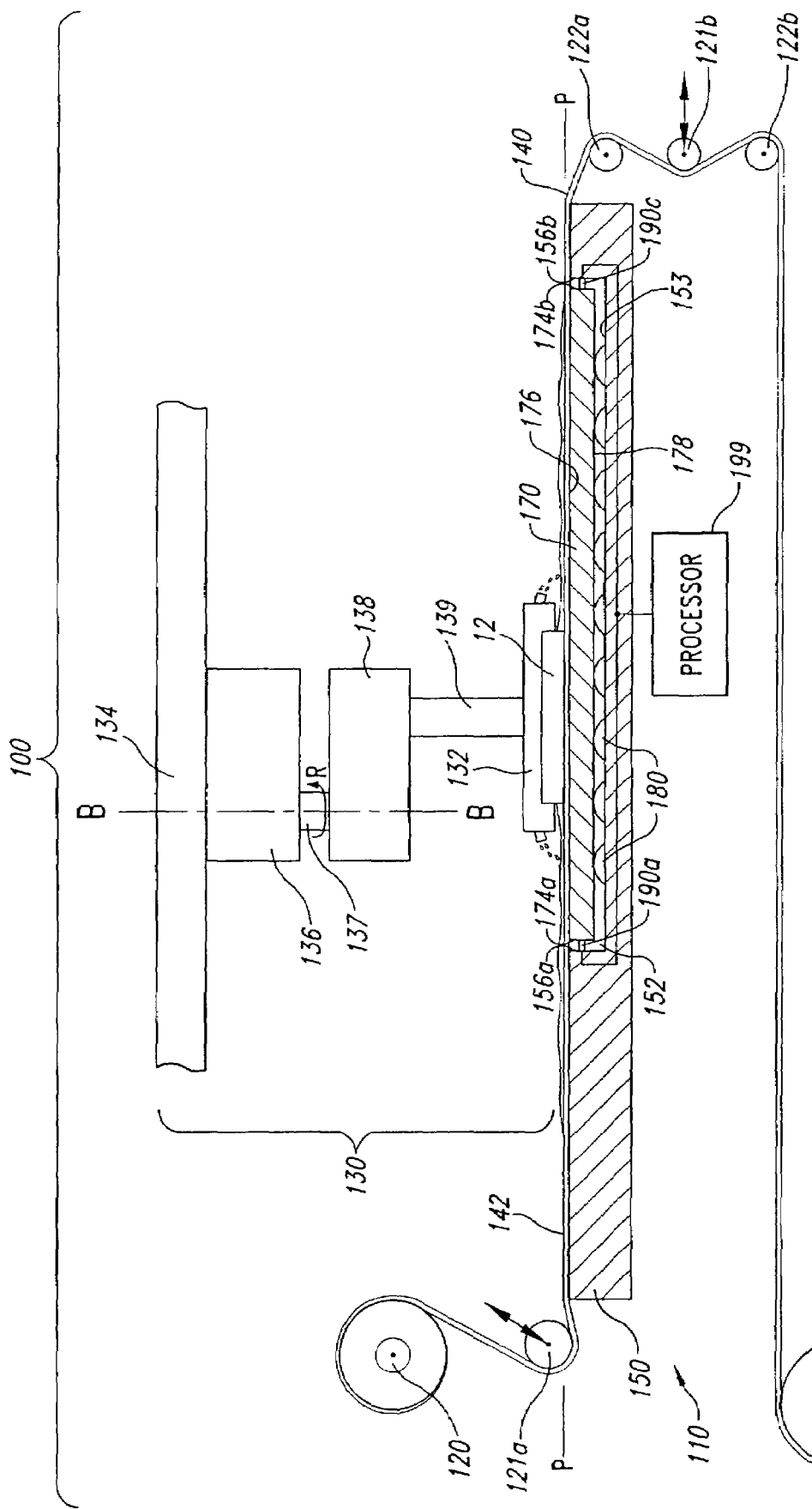
FIG. 8 is a schematic cross-sectional view of the planarizing machine of FIG. 7 along line 8-8.

FIG. 8 is a schematic cross-sectional view of the planarizing machine 100 illustrating the endpointing apparatus in greater detail. Referring to FIGS. 7 and 8 together, the sub-platen 150 can be a base supporting the platen 170. The sub-platen 150 has a recess 152 defined by a base surface 153 and a plurality of walls (identified by reference numbers 154a, 154b, 156a and 156b) projecting upwardly from the base surface 153 transversely with respect to a planarizing plane P-P (FIG. 8). For the purposes of the present disclosure, the term "transverse" means any non-parallel arrangement and is not limited to a perpendicular arrangement. The walls can include a first side-wall 154a, a second side-wall 154b opposite the first side-wall 154a, a first end-wall 156a at one end of the side-walls 154a and 154b, and a second end-wall 156b at the other end of the side-walls 154a and 154b. The walls can be configured in a rectilinear pattern or other suitable patterns to receive the platen 170.

The platen 170 is positioned in the recess 152 of the sub-platen 150. The platen 170 can be a plate having a first side-face 172a, a second side-face 172b opposite the first side-face 172a, a first end-face 174a between one end of the side-faces 172a and 172b, and a second end-face 174b between the other end of the side-faces 172a and 172b. In the embodiment shown in FIG. 3, the first side-face 172a is adjacent to the first side-wall 154a, the second side-face 172b is adjacent to the second side-wall 154b, the first end-face 174a is adjacent to the first end-wall 156a, and the second end-face 174b is adjacent to the second end-wall 156b. The platen 170 also includes a bearing surface 176 facing the backside of the polishing pad 140 to support at least a portion of the polishing pad 140 in a planarizing zone under the head 132. The platen 170 further includes a back surface 178 facing the base surface 153 of the sub-platen 150. The polishing pad 140 is coupled to the bearing surface 176 during planarization so that the pad transmits lateral forces to the platen 170. Suitable devices and methods for coupling the polishing pad 140 to the bearing surface 176 are disclosed in U.S. patent application Ser. No. 09/285,319 filed on Apr. 2, 1999, and U.S. Ser. No. 09/181,578 filed on Oct. 28, 1998, both of which are herein incorporated by reference.

The platen 170 can move with respect to the sub-platen 150 in a lateral motion at least generally parallel to a planarizing plane P-P (FIG. 8). In this embodiment, the endpointing apparatus also includes a bearing mechanism 180 (FIG. 8) to reduce the friction between the base surface 153 of the sub-platen 150 and the back surface 178 of the platen 170. The bearing assembly 180 can be a roller mechanism having a plurality of rollers attached to either the sub-platen 150 or the platen 170 to allow the platen 170 to freely roll across the sub-platen 150. The bearing assembly 180 can also be a low-friction coating or lubricant between the base surface 153 and the back surface 178, or a flexible bladder (not shown) between the sub-platen 150 and the platen 170. In still another embodiment, the bearing assembly 180 can be a frictionless device having a number of air bearings defined by air holes through the sub-platen 150 that are connected to a pressurized air source that provides a continuous layer of air between the sub-platen 150 and the platen 170. In still another embodiment, the bearing assembly 180 can be a magnetic device including magnetic bearings that prevent the back surface 178 from contacting the base surface 153 by positioning magnetic fields of a like polarity adjacent to one another. In operation, the bearing assembly 180 can frictionally isolate the platen 170 from the sub-platen 150 so that the drag forces between the substrate assembly 12 and the pad 140 drive the platen 170 laterally with respect to the sub-platen 150 without substantial friction losses.

The force detectors 190 (identified by reference numbers 190a-190d) can be positioned between the walls of the recess 152 in the sub-platen 150 and the faces of the platen 170. Each force detector 190 can be a contact sensor that contacts both the sub-platen 150 and the platen 170 to sense the lateral forces exerted by the platen 170 against the sub-platen 150 in correlation to the lateral forces exerted by the substrate assembly 12 against the polishing pad 140 during planarization. Suitable contact force detectors are strain gauges, piezoelectric elements or other transducers that generate signals corresponding to the force exerted by the platen 170 against the sub-platen 150. The force detectors 190 can be other sensors that generate electrical signals corresponding to the lateral forces or displacement between the sub-platen 150 and the platen 170. For example, in other embodiments in which the force detectors 190 do not contact the platen 170 and the sub-platen 150 does not have dead stops so that the platen 170 can move relative to the sub-platen 150, the force detectors 190 can be lasers, accelerometers, capacitance displacement sensors, linear variable differential transformers or other displacement sensors.

In the particular embodiment of the planarizing machine 100 illustrated in FIGS. 7 and 8, four force detectors 190a-190d are configured along two orthogonal lateral axes $L_1$ and $L_2$. Each lateral axis $L_1$ and $L_2$ defines a lateral axis along which the drag forces between the pad 140 and the substrate assembly 12 can be measured to generate the drag force waveform 432 shown in FIG. 5. In other embodiments, the planarizing machine 100 can have only one force detector positioned along one axis, or two force detectors positioned along two orthogonal axes, or any number of force detectors positioned between the walls of the sub-platen 150 and the faces of the platen 170. For example, in an embodiment having two force detectors 190 positioned along orthogonal axes, a first force detector 190a can contact the first end-wall 156a and the first end-face 174a at a first force detector site, a second force detector 190b can contact the first side-wall 154a and the first side-face 172a at a second force detector site, and dead stops can be substituted for the force detectors 190c and 190d. The first end-wall 156a and the first side-wall 154a of the sub-platen 150 accordingly define first and second stop surfaces, and the first end-face 174a and the first side-face 172a of the platen 170 accordingly define first and second contact surfaces. In still another embodiment, the first and second force detectors 190a and 190b can be positioned as explained above, and the dead stops or force detectors 190c and 190d can be eliminated by sizing the platen 170 such that the second end-face 174b abuts the second end-wall 156b and the second side-face 172b abuts the second side-wall 154b.

Figure 9:
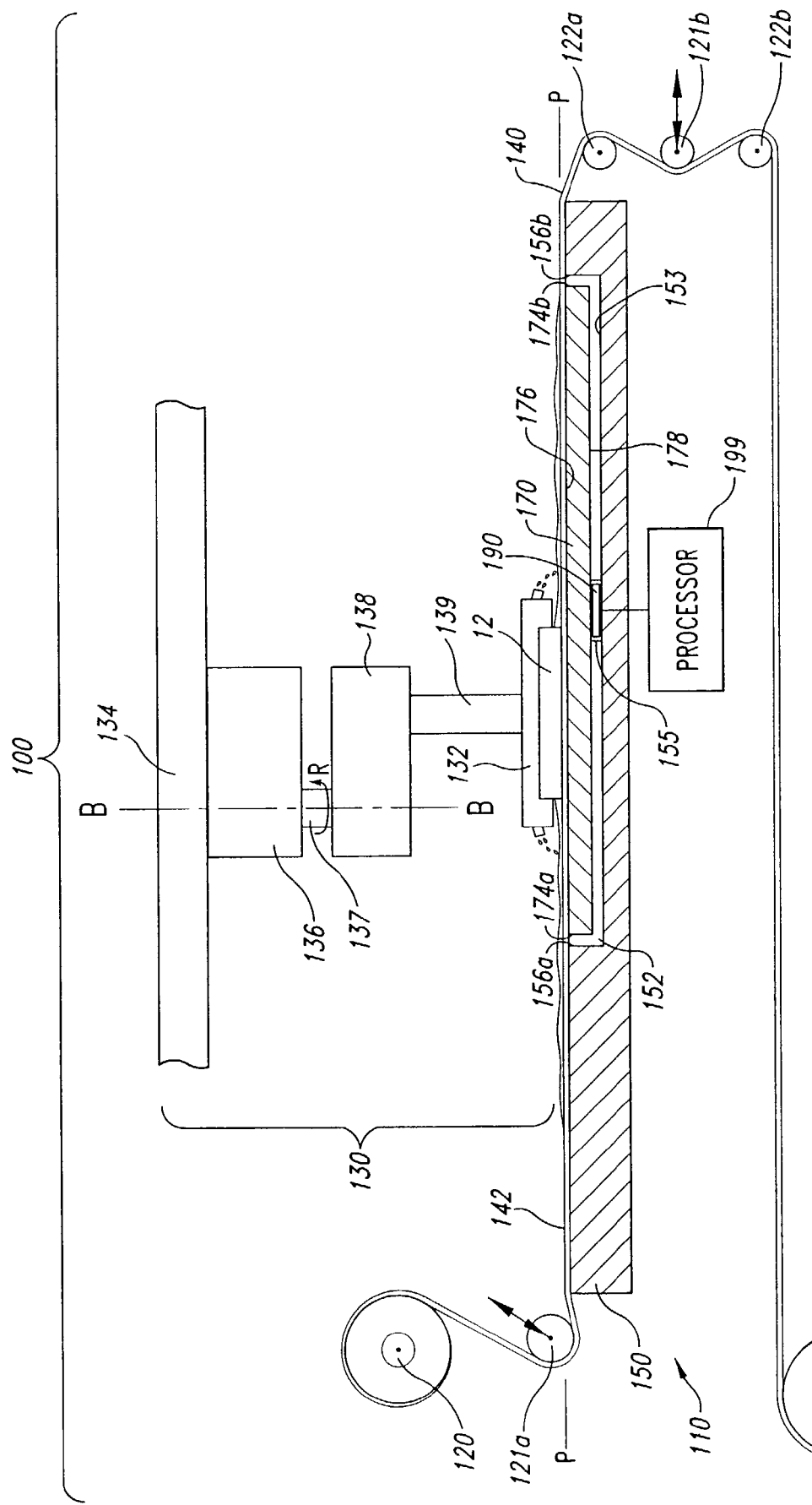
FIG. 9 is a schematic cross-sectional view of a planarizing machine in accordance with another embodiment of the invention.

FIG. 9 is a schematic cross-sectional view of the planarizing machine 100 in accordance with another embodiment of the invention. In this embodiment, the sub-platen 150 has a post 155 projecting upwardly from the base surface 153, and the platen 170 is fixedly attached to the post 155. The walls 172/174 of the platen 170 do not contact either dead stops, the faces 154/156 of the sub-platen 150, or other devices that inhibit the platen 170 from moving with respect to the sub-platen 150. The movement of the substrate assembly 12 across the polishing pad 140 accordingly displaces the platen 170 relative to the sub-platen 150 and generates torsional forces in the post 155 that are expected to be proportionate to the drag force between the substrate assembly 12 and the polishing pad 140. The force detector 190 can be a strain gauge attached to the post 155 to measure the torsional displacement of the post 155, a laser, or another type of displacement sensor. The force detector 190 accordingly senses the change in the displacement or the torsional forces exerted on the platen 170 and sends a corresponding signal to the processor 199a.

Figure 10:
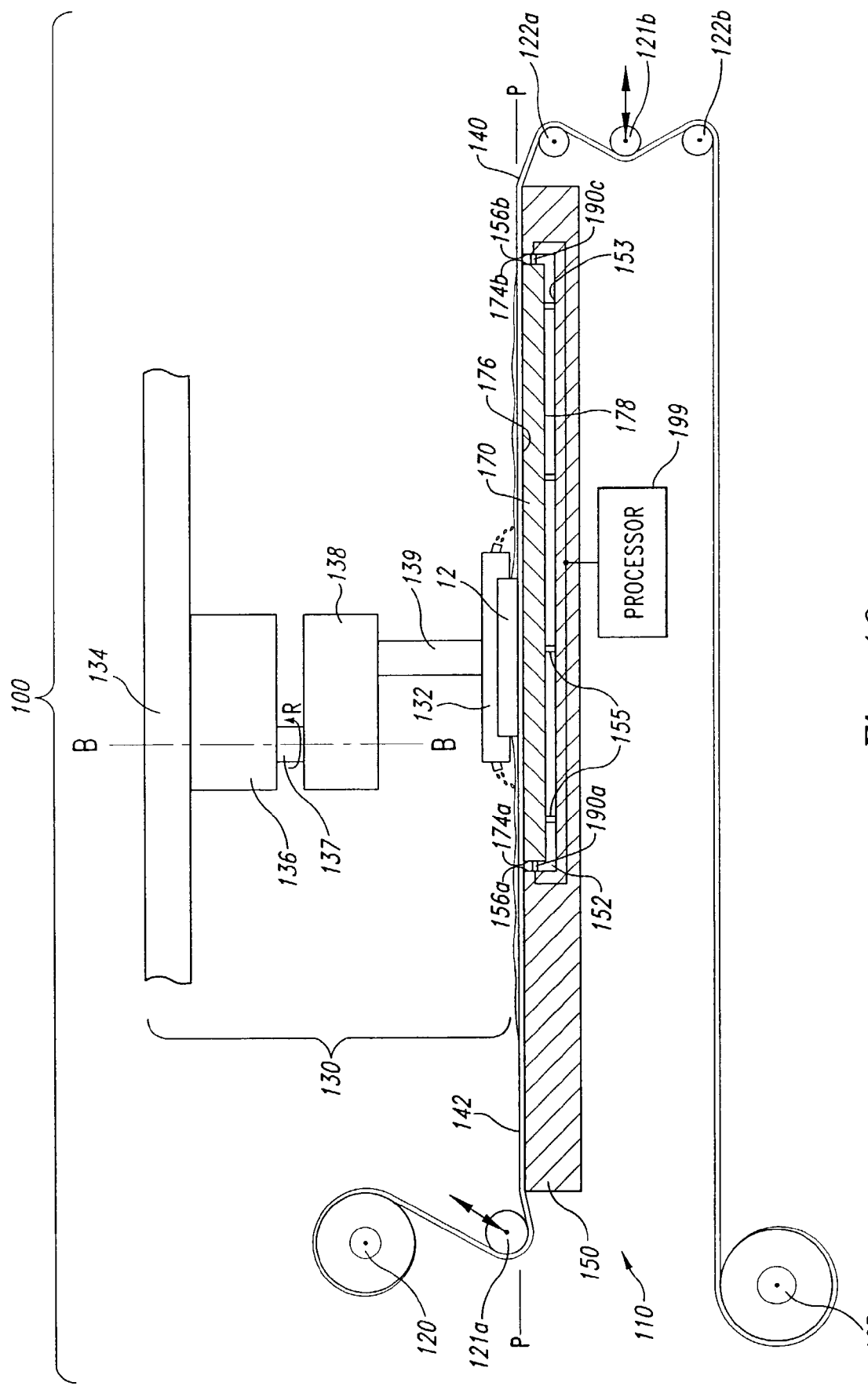
FIG. 10 is a schematic cross-sectional view of a planarizing machine in accordance with still another embodiment of the invention.

FIG. 10 is a schematic cross-sectional view of the planarizing machine 100 in accordance with another embodiment of the invention in which a number of small posts 155 attach the platen 170 to the sub-platen 150. As with the embodiment of the planarizing machine shown in FIG. 10, the walls 172/174 of the platen 170 do not contact either dead stops, the faces 154/156 of the sub-platen 150, or other devices that inhibit the platen 170 from moving with respect to the sub-platen 150. The posts 155 can be threaded studs having a diameter of approximately 1.0 inch and a length of 3.0 inches made from metal, high density polymers or other suitable materials. The posts 155 can also be other supports that can flex more in one direction than others, and the posts 155 can be made from other materials. The posts 155 of this embodiment accordingly do not frictionally isolate the platen 170 from the sub-platen 150, but rather they deflect to control the motion between the platen 170 and the sub-platen 150 in correspondence to the drag forces between the substrate assembly 12 and the polishing pad 140. The force detectors 190 accordingly measure the displacement between the platen 170 and the sub-platen 150 to determine the drag forces between the substrate assembly 12 and the polishing pad 140.

Figure 11:
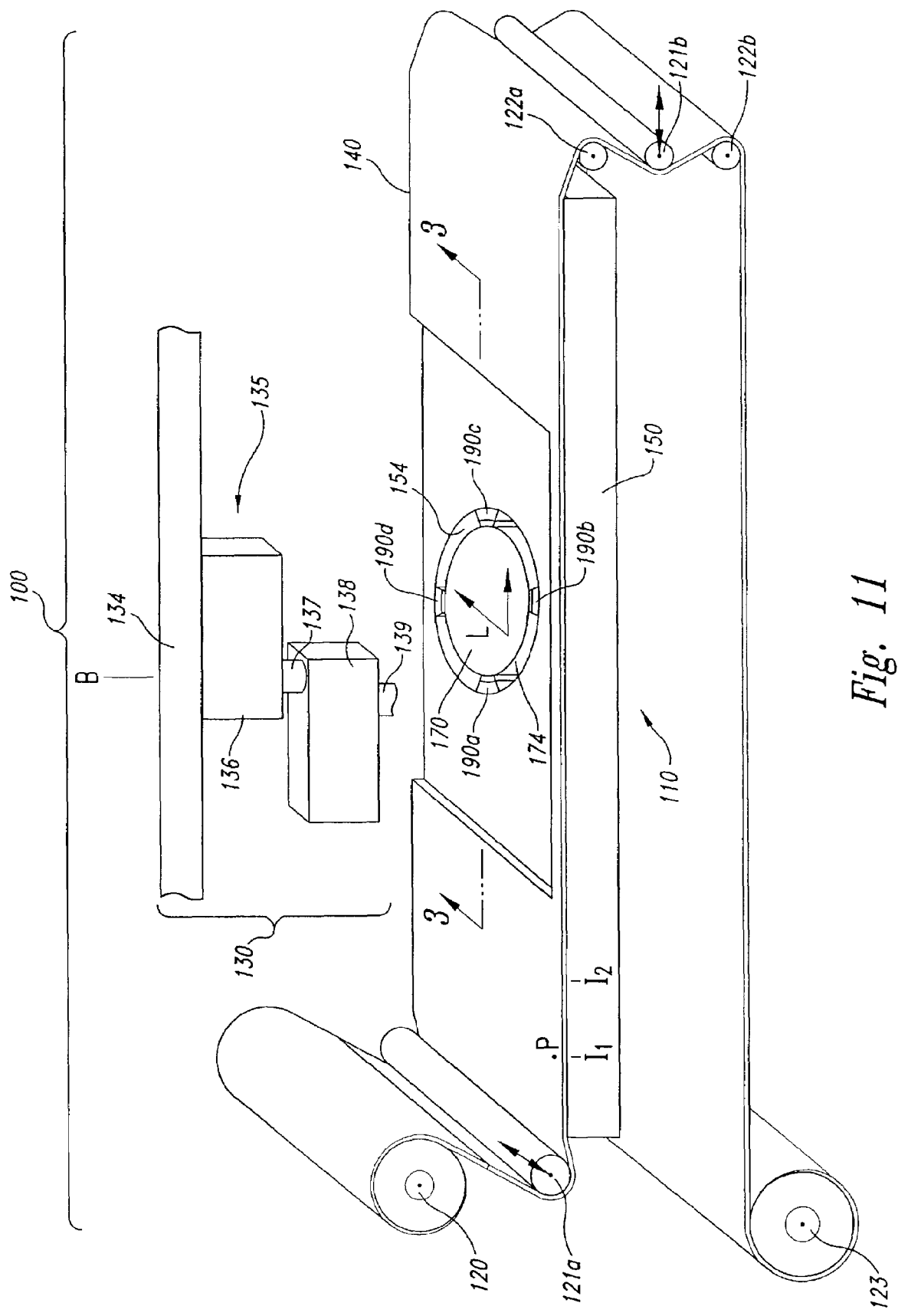
FIG. 11 is a schematic isometric view of a planarizing machine in accordance with another embodiment of the invention.

FIG. 11 is a schematic isometric view of a planarizing machine 100 in accordance with still another embodiment of the invention. In this embodiment, the planarizing machine 100 has a circular platen 170 and the recess 152 in the sub-platen 150 has a single circular wall 154. The platen 170 accordingly has a single, circular side-face 174. The platen 170 can be coupled to the sub-platen 150 by any of the bearings 180 or posts 155 described above with reference to FIGS. 7-10.

Figure 12:
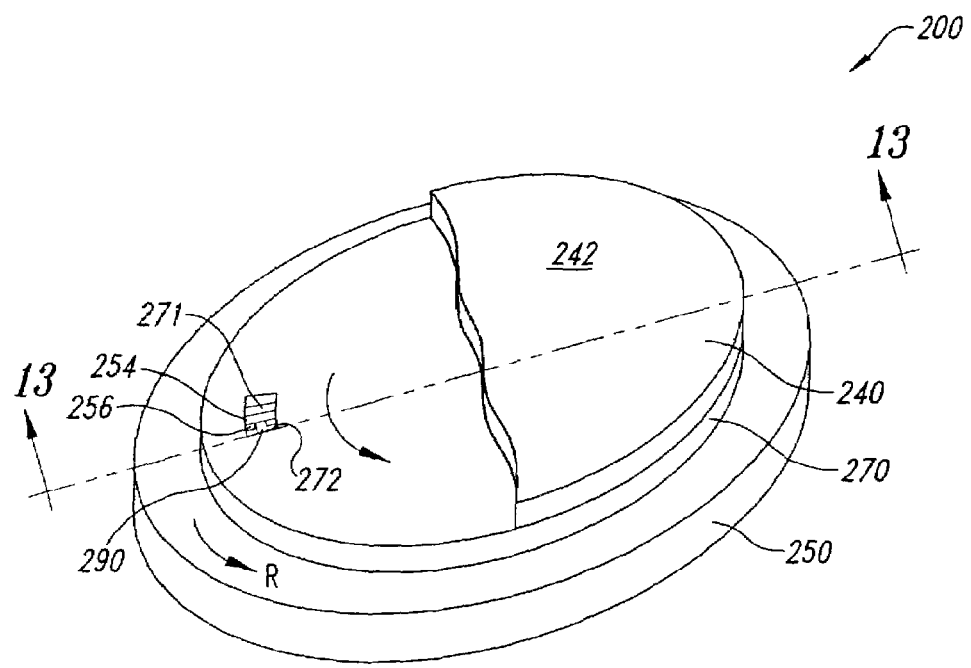
FIG. 12 is a schematic isometric view of a rotary planarizing machine with a cut-away section illustrating an endpointing apparatus in accordance with another embodiment of the invention.
Figure 13:
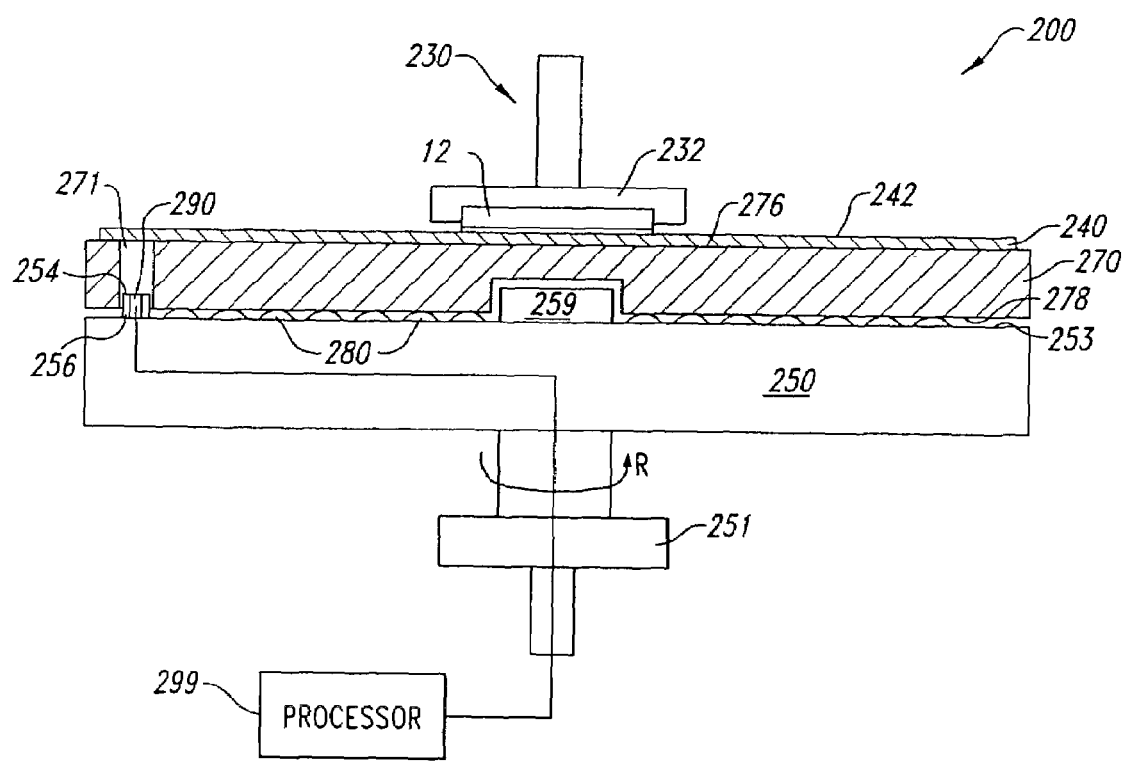
FIG. 13 is a schematic cross-sectional view of the planarizing machine of FIG. 12 taken along line 13-13.

FIG. 12 is a schematic isometric view of a planarizing machine 200 in accordance with another embodiment of the invention, and FIG. 13 is a schematic cross-sectional view of the planarizing machine 200 shown in FIG. 12 taken along line 13-13. The planarizing machine 200 has a sub-platen 250 coupled to a rotary drive mechanism 251 to rotate the sub-platen 250 (arrow R), a platen 270 movably coupled to the sub-platen 250, and a polishing pad 240 attached to the platen 270. The sub-platen 250 has a base surface 253 facing the polishing pad 240 and a tab 254 projecting upwardly from the base surface 253. The tab 254 has a stop surface 256 facing in the direction of the rotation of the sub-platen 250. The platen 270 includes an opening 271 having a contact surface 272 facing the stop surface 256 of the tab 254. The planarizing machine 200 further includes a bearing assembly 280 that can be the same as the bearing assembly 180 described above with reference to FIG. 8. The planarizing machine 200 also includes a force detector 290 contacting the stop surface 256 of the tab 254 and the contact surface 272 of the platen 270.

The planarizing machine 200 is expected to enhance the accuracy of detecting the endpoint of planarizing a substrate assembly in rotary planarizing applications. In operation, a carrier assembly 230 (FIG. 13) moves a carrier head 232 to press the substrate assembly 12 against a planarizing surface 242 of the polishing pad 240. The rotary drive assembly 251 also rotates the sub-platen 250 causing the tab 254 to press the force detector 290 against the contact surface 272. The sub-platen 250 accordingly rotates the platen 270 in the direction R, but the drag force between the substrate assembly 12 and the polishing pad 240 resists rotation in the direction R. The bearing assembly 280 allows the drag forces between the substrate assembly 12 and the planarizing surface 242 to drive the contact surface 272 of the platen 270 against the force detector 290 in correlation to the drag forces. As the drag force increases between the substrate assembly 12 and the planarizing surface 242, the force detector 290 accordingly detects an increase in the lateral force that the platen 270 exerts against the tab 254. The force detector 290 is coupled to a processor 299 to convert the signals from the force detector 290 into data that can be analyzed to determine the endpoint of the planarizing process as described above with reference to FIGS. 2-6.

Figure 14:
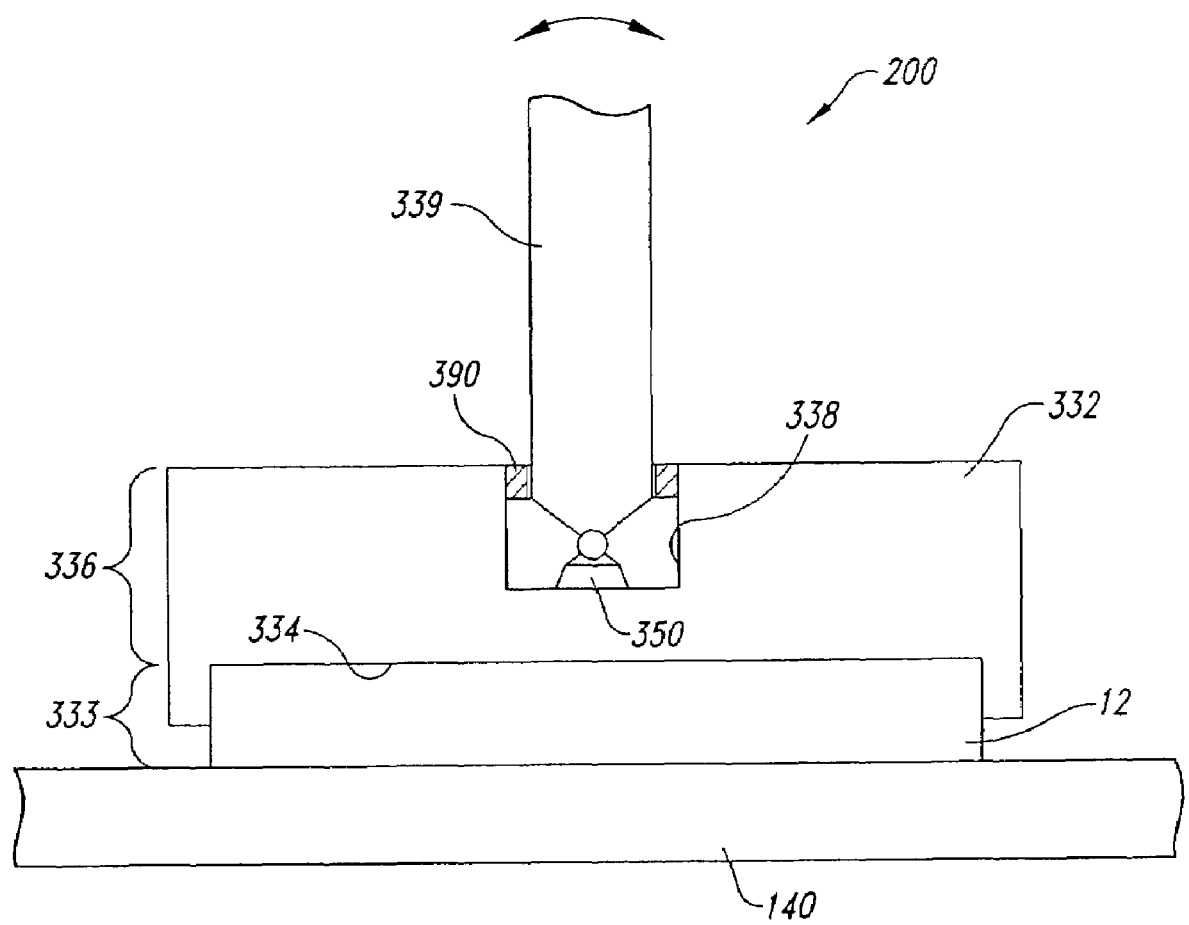
FIG. 14 is a schematic cross-sectional view of a substrate holder having an endpointing apparatus in accordance with yet another embodiment of the invention.

FIG. 14 is a schematic cross-sectional view of a carrier system 330 for a planarizing machine in accordance with another embodiment of the invention. The carrier assembly 330 can include a carrier head 332 having a lower portion 333 with a lower cavity 334 to receive a substrate assembly 12 and an upper portion 336 with an upper cavity 338. A pivoting joint 350 is attached to the head 332 in the cavity 338, and a drive-shaft 339 is pivotally attached to the joint 350. In this embodiment, the endpointing apparatus includes a primary support member defined by the head 332, a secondary support member defined by the drive-shaft 339, and a first contact surface defined by the side-wall of the upper cavity 338. In one embodiment, the joint 350 is a gimbal joint or other bearing assembly that allows universal pivoting between the head 332 and the shaft 339. The carrier head 332 also includes a force detector 390 attached to an interior wall of the cavity 338. The force detector 390, for example, can be an annular piezoelectric ring.

In operation, the drag forces between the substrate assembly 12 and the polishing pad 140 cause the shaft 339 to pivot about the joint 350 such that the lower end of the shaft 339 contacts the force detector 390. The force exerted by the driveshaft 339 against the force detector 390 will be proportional to the drag forces between the substrate assembly 12 and the polishing pad 140. Accordingly, the isolated drag force parameter of this embodiment is the displacement between the shaft 339 and the carrier head 332. The force detector 390 is coupled to a processor 199a (FIG. 2) to detect the endpoint of the planarizing process in a manner similar to that described above with respect to FIGS. 2-6.

D. Monitoring and Controlling Applications

The planarizing machines and methods described above with reference to FIGS. 2-14 are expected to enhance the accuracy of endpointing CMP processing compared to processes and devices that monitor changes in the current of the drive motors. The methods described above with reference to FIGS. 2-6, for example, accurately endpoint CMP processing because they accurately estimate the exposure time of the endpoint layer by measuring the peak drag forces between the substrate assembly and the polishing pad along a lateral axis to obtain a peak drag force waveform, developing a peak drag force curve from the peak drag force waveform, and determining a reference time at the intersection of a first line corresponding to a downwardly sloping section of the drag force curve and a second line corresponding to a relatively flat section of the drag force curve. One aspect of several embodiments of methods set forth above with respect to FIGS. 2-6 is that the drag force monitoring systems accurately measure the minimum and maximum peak drag forces along a lateral axis generally parallel to a plane defined by the pad/substrate interface. Another aspect of several embodiments of these methods is that the peak drag forces, or the differences between the maximum peak drag forces and the minimum peak drag forces, can be correlated with time in a peak drag force curve that accurately indicates an estimated exposure time for the endpoint layer. Compared to conventional endpointing methods that may or may not provide a significant signal change as the endpoint layer is exposed, the peak-to-peak processing of the drag force waveform provides a more significant change to identify the exposure of the endpoint layer. As such, several embodiments of the methods described above with reference to FIGS. 2-6 can accurately endpoint CMP processing.

The planarizing machines described above with reference to FIGS. 2 and 7-14 are further expected to enhance the accuracy of endpointing CMP processing because they isolate a drag force parameter that is not influenced by energy losses unrelated to the drag force at the pad/substrate interface. In contrast to conventional planarizing processes that endpoint CMP processing using the current of the drive motors, several embodiments of the planarizing machines described above with reference to FIGS. 7-14 measure the drag force between the substrate assembly and the polishing pad by isolating the displacement or the lateral forces between either a platen and sub-platen, or a carrier head and a drive shaft. The isolated drag force parameter provides a much more accurate indication of the actual drag force at the pad/substrate interface than measuring motor current because energy losses and other factors associated with moving the carrier head or the polishing pad do not influence or otherwise overshadow the changes in drag force between the pad and the substrate assembly. The endpointing apparatuses and monitoring systems described above with reference to FIGS. 7-14, therefore, are expected to enhance the accuracy of detecting the endpoint in CMP processing.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method of mechanical or chemical-mechanical planarization of a plurality of microelectronic substrate assemblies, comprising:

removing material from each of the plurality of substrate assemblies, and while each of the plurality of substrate assemblies, generating drag forces on the substrate assembly and a polishing pad by pressing the substrate assembly against the polishing pad at a pad/substrate interface and moving at least one of the substrate assembly and the pad relative to the other in a planarizing plane; and while removing material from one of the plurality of substrate assemblies:

sensing the forces between the primary support member and a second support member that is coupled to the primary support member;

collecting data points indicative of the drag force while planarizing the first substrate assembly against the polishing pad;

processing the collected data points to generate a force-time relationship between the collected data points and time;

performing a first regression on a downward slope in the force-time relationship to determine a first line;

performing a second regression on a relatively flat slope in the force-time relationship to determine a second line;

assessing a reference time at an intersection of the first line and the second line;

calculating an estimated time for completion of the planarization process to be equal to the reference time plus an over-polish time; and utilizing the estimated time to determine when the planarization process of at least one of the plurality of substrate assemblies is terminated.

2. The method of claim 1 wherein the act of utilizing the estimated time to determine when the planarization process of at least one of the plurality of substrate assemblies is terminated comprises utilizing the estimated time to determine when the planarization process of one of the substrate assemblies in which the estimated time was calculated from is terminated.

3. The method of claim 1, further comprising supporting the polishing pad with the primary support member.

4. The method of claim 1 wherein the act of removing material from each of the plurality of substrate assemblies comprises removing material from the substrate assembly comprising a shallow-trench-isolation structure including a substrate having trenches, an endpoint layer over the substrate, and a cover layer over the endpoint layer that fills the trenches.

5. The method of claim 1 wherein the act of removing material from each of the plurality of substrate assemblies comprises removing material from the substrate assembly comprising a shallow-trench-isolation structure including a substrate having trenches, a silicon nitride endpoint layer over the substrate, and a silicon dioxide cover layer over the endpoint layer that fills the trenches.

6. The method of claim 1 wherein the act of removing material from each of the plurality of substrate assemblies comprises:

removing material from at least one of the plurality of substrate assemblies including a substrate, an endpoint layer over the substrate, and a cover layer over the endpoint layer; and the act of terminating planarization comprises terminating planarization of one of the plurality of substrate assemblies at the estimated time for completion when the endpoint layer has been exposed.

* * * * *